(12) United States Patent
Kihara (10) Patent No.: US 9,742,388 B2
(45) Date of Patent: Aug. 22, 2017

(54) DRIVER CIRCUIT (71) Applicant: SHARP KABUSHIKI KAISHA, Sakai, Osaka (JP)

(72) Inventor: Seiichiro Kihara, Sakai (JP)

(73) Assignee: SHARP KABUSHIKI KAISHA, Osaka (JP)

(*) Notice: Subject to any disclaimer, the term of this patent is extended or adjusted under 35 U.S.C. 154(b) by 0 days.

(21) Appl. No.: 15/127,979

(22) PCT Filed: Feb. 17, 2015

(86) PCT No.: PCT/JP2015/054228
§ 371 (c)(1),
(2) Date: Sep. 21, 2016

(87) PCT Pub. No.: WO2015/182175
PCT Pub. Date: Dec. 3, 2015

(65) Prior Publication Data
US 2017/0093389 A1 Mar. 30, 2017

(30) Foreign Application Priority Data
May 28, 2014 (JP) .................. 2014-110412

(51) Int. Cl.
H03K 17/0812 (2006.01)
H03K 17/06 (2006.01)
H03K 17/04 (2006.01)
H03K 3/014 (2006.01)

(52) U.S. Cl.
CPC ....... *H03K 17/08128* (2013.01); *H03K 3/014* (2013.01); *H03K 17/0406* (2013.01); *H03K 17/063* (2013.01)

(58) Field of Classification Search
CPC .. H03K 3/014; H03K 17/0406; H03K 17/063; H03K 17/08128
USPC ...................... 326/82, 83; 327/108
See application file for complete search history.

(56) References Cited

U.S. PATENT DOCUMENTS

| 8,044,699 B1* | 10/2011 | Kelly | H03K 19/017536 327/333 |
| 8,558,586 B1* | 10/2013 | Martin | G11C 7/1057 327/108 |
| 2004/0213026 A1* | 10/2004 | Park | H02M 1/088 363/132 |

(Continued)

FOREIGN PATENT DOCUMENTS

| JP | 4958927 B2 | 6/2012 |
| JP | 5236822 B1 | 7/2013 |
| JP | 5331087 B2 | 10/2013 |

*Primary Examiner* — William Hernandez
(74) *Attorney, Agent, or Firm* — Birch, Stewart, Kolasch & Birch, LLP (57) ABSTRACT

A driver circuit includes normally-on transistors (Q1, Q2), control circuits (1, 2) that control the transistors (Q1, Q2), a capacitor (4) connected between power source nodes (1c, 1d) of the control circuit (1), a power source (7) connected between power source nodes (2c, 2d) of the control circuit (2), a MOSFET (16) connected between the power source nodes (1d, 2d), a control circuit (3) that turns on the MOSFET (16) when an output voltage VO reaches approximately 0 V, and a startup circuit that includes a Zener diode (20) connected in parallel to the capacitor (4) and that can charge the capacitor (4) with a Zener voltage even when the MOSFET (16) is off.

20 Claims, 5 Drawing Sheets (56) References Cited

U.S. PATENT DOCUMENTS

| | | | |
|---|---|---|---|
| 2008/0100378 A1* | 5/2008 | Bernacchia | H02M 7/5388 |
| | | | 327/589 |
| 2010/0207450 A1 | 8/2010 | Ogawa et al. | |
| 2013/0200926 A1* | 8/2013 | Kihara | H03K 17/063 |
| | | | 327/108 |
| 2013/0215653 A1* | 8/2013 | Kihara | H02M 7/5387 |
| | | | 363/56.01 |
| 2014/0375292 A1 | 12/2014 | Kihara et al. | |
| 2016/0079975 A1* | 3/2016 | Kinzer | H03K 17/687 |
| | | | 327/109 |

* cited by examiner

DRIVER CIRCUIT

TECHNICAL FIELD

The present invention relates to driver circuits.

BACKGROUND ART

An element formed of a wide band gap semiconductor, representative examples of which include GaN and SiC, has excellent characteristics such as high-speed switching and a low on-resistance value, as compared to an element formed of a silicon semiconductor. Among elements formed of a wide band gap semiconductor, there is an element that exhibits a normally-on property in which a drain current flows even when a gate voltage is 0 V, or an element that exhibits a normally-off property having a low threshold voltage of approximately 2 V. In order to reliably control an element having a normally-on property, the gate voltage needs to be driven to a negative voltage.

PTL 1 discloses a power conversion circuit in which a bridge circuit constituted by upper and lower arms is formed by using normally-on transistors. PTL 2 discloses a protection circuit for an arm short in a driver circuit (inverter circuit) that uses a normally-on transistor. PTL 3 discloses a technique for achieving self-feeding of a power source in a control circuit (driving circuit) of a normally-on transistor.

CITATION LIST

Patent Literature

PTL 1: Japanese Patent No. 4958927
PTL 2: Japanese Patent No. 5331087
PTL 3: Japanese Patent No. 5236822

SUMMARY OF INVENTION

Technical Problem

A normally-on transistor enters an on state before a power source is supplied to a driving circuit that drives the gate thereof, or in other words, before the driving circuit is started. Therefore, in a configuration in which an input voltage (a voltage to be subjected to power conversion) from a main power source is applied to a bridge circuit (inverter circuit) in which normally-on transistors are bridge-connected in two stages of upper and lower stages, there is a possibility that the main power source becomes short-circuited before the driving circuit is started. Thus, a protection circuit for preventing this short-circuited state becomes necessary.

In this respect, in PTL 1, a relay is provided as a protection circuit between a bridge circuit and a main power source. This is for preventing a short circuit of the main power source by turning off the relay before the driving circuit is started, but this requires separate relay switch and relay control circuit. Furthermore, a power source for an electromagnet for the relay switch needs to be prepared separately. This leads to an increase in the size and the complexity of the circuit.

Figure 8:
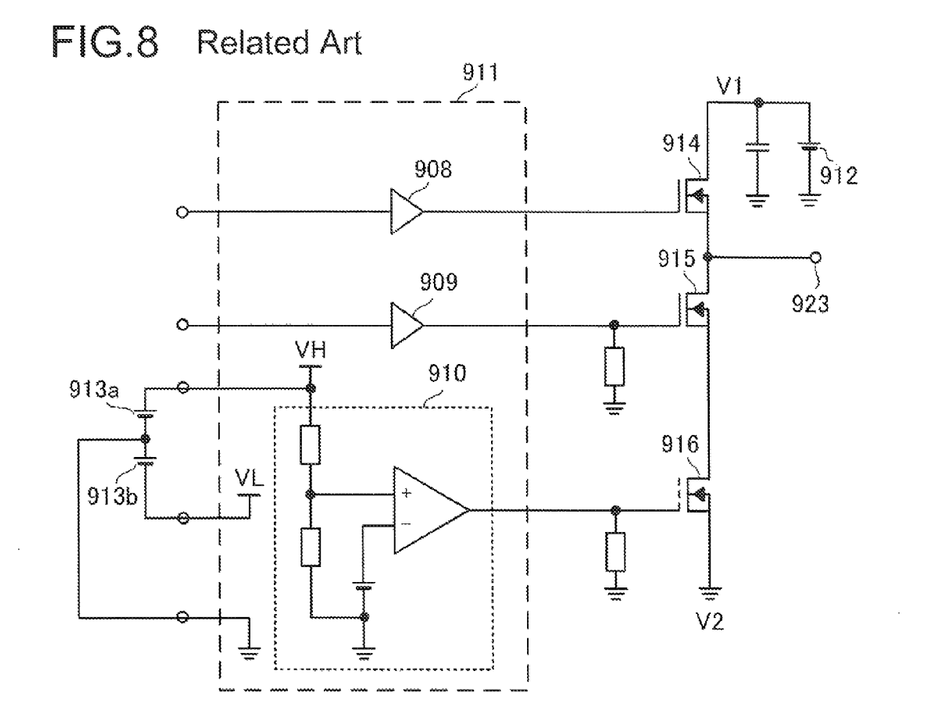
FIG. 8 is a circuit diagram of a conventional configuration.

FIG. 8 illustrates a driver circuit that includes a protection circuit, and this corresponds to the content disclosed in PTL 2. With a base voltage V2 serving as a reference, a voltage V1 from a main power source 912 is applied to a series circuit of an upper-side transistor 914, a lower-side transistor 915, which are normally-on transistors, and a normally-off transistor 916, and an output 923 is extracted from between the transistors 914 and 915. A control circuit 911 includes control circuits 908, 909, and 910 for the transistors 914, 915, and 916 and operates in accordance with driving voltages VH and VL that are based on outputs of power sources 913a and 913b. In a situation in which only the power sources for the control circuit 911 shut down due to an overload, a momentary power failure, or the like while the main power source 912 does not turn off after the driver circuit is started, the upper-side transistor 914 turns on, and the output 923 becomes a high level; meanwhile, the lower-side transistor 915 is turned off as the drain voltage of the transistor 916 rises. In other words, the driver circuit is protected from an arm short even in a case in which the control circuit 911 itself does not operate (refer to paragraphs [0044] to [0046] of PTL 2).

However, there remains a problem in that, in a state in which the output 923 is at the high level, the control circuit 908 on the upper side cannot be restarted unless processing of temporarily stopping the operation of the main power source 912 and restarting the main power source 912 after starting the control circuit 911 first is carried out (reasons therefor will be described later in detail). In order to implement the aforementioned processing, the driver circuit needs to be equipped with a function dedicated for this processing, and this may lead to an increase in the size and the complexity of the circuit.

An increase in the size and the complexity of the circuit leads to an increase in the cost, which hinders the spread of a driver circuit that uses a normally-on transistor.

Accordingly, the present invention is directed to providing a driver circuit that prevents a short in serially connected normally-on transistors and that also contributes to reducing the size of the circuit and to simplifying the circuit.

Solution to Problem

A driver circuit according to the present invention includes a first transistor connected between a line of a first voltage and an output terminal, a second transistor connected between the output terminal and a line of a second voltage lower than the first voltage, a first control circuit having first and second power source nodes and configured to provide a voltage of the first power source node to a control electrode of the first transistor in response to an input signal being set to a first logic level so as to turn on the first transistor and to provide a voltage of the second power source node to the control electrode of the first transistor in response to the input signal being set to a second logic level so as to turn off the first transistor, and a second control circuit having third and fourth power source nodes and configured to provide a voltage of the fourth power source node to a control electrode of the second transistor in response to the input signal being set to the first logic level so as to turn off the second transistor and to provide a voltage of the third power source node to the control electrode of the second transistor in response to the input signal being set to the second logic level so as to turn on the second transistor. Each of the first and second transistors is a normally-on transistor. The first power source node is connected to the output terminal. The third power source node receives the second voltage. The fourth power source node receives a third voltage lower than the second voltage. The driver circuit further includes a capacitor connected between the first and second power source nodes, a switching element connected between the second and fourth power source nodes, a third control circuit configured to turn on the switching element so as to charge the capacitor in response to a voltage corresponding to a difference between a voltage of the output terminal and the second voltage falling below a preset voltage, and a startup circuit having a voltage generating component connected between the first and second power source nodes and a current passing component connected between the second and third power source nodes and capable of charging the capacitor on the basis of a generated voltage of the voltage generating component even when the switching element is off by causing a current that is based on a voltage across the first and third power source nodes to pass through the voltage generating component and the current passing component.

Advantageous Effects of Invention

According to the present invention, a driver circuit that prevents a short in serially connected normally-on transistors and that also contributes to reducing the size of the circuit and to simplifying the circuit can be provided.

DESCRIPTION OF EMBODIMENTS

Hereinafter, examples of embodiments of the present invention will be described in concrete terms with reference to the drawings. In the drawings to be referred to, identical portions are given identical symbols, and duplicate descriptions pertaining to the identical portions are omitted as a general rule. It is to be noted that, in the present specification, for simplifying the descriptions, by assigning a sign or a symbol that refers to information, a signal, a physical quantity, a quantity of state, a member, or the like, the name of the information, the signal, the physical quantity, the quantity of state, the member, or the like corresponding to the sign or the symbol may be omitted or abbreviated.

First Embodiment

Figure 1:
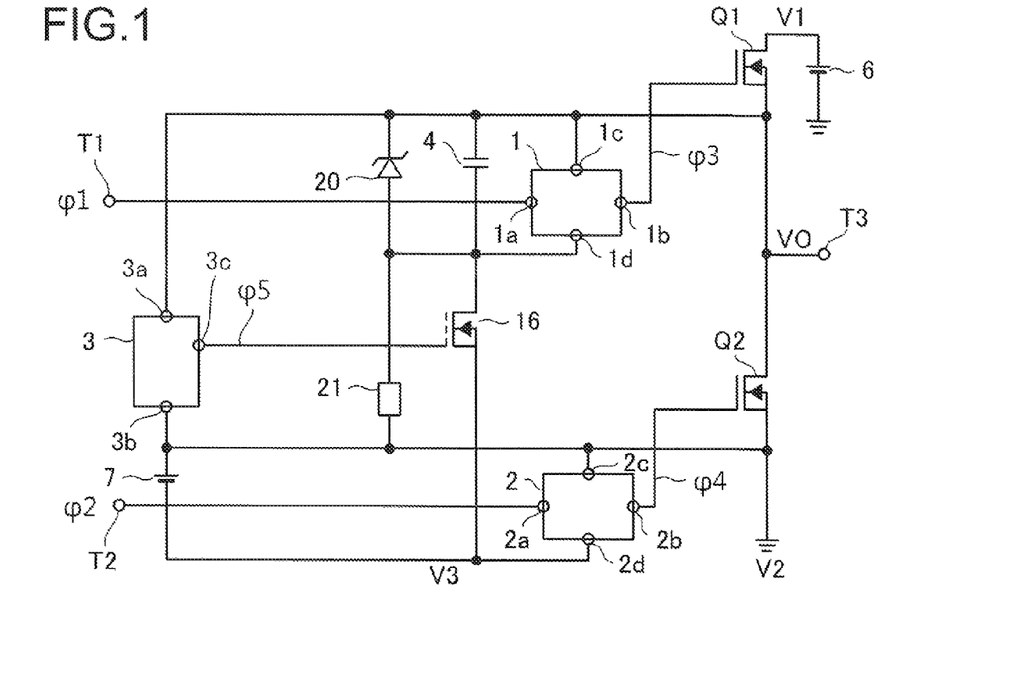
FIG. 1 is a circuit block diagram illustrating a configuration of a driver circuit according to a first embodiment of the present invention.
Figure 2:
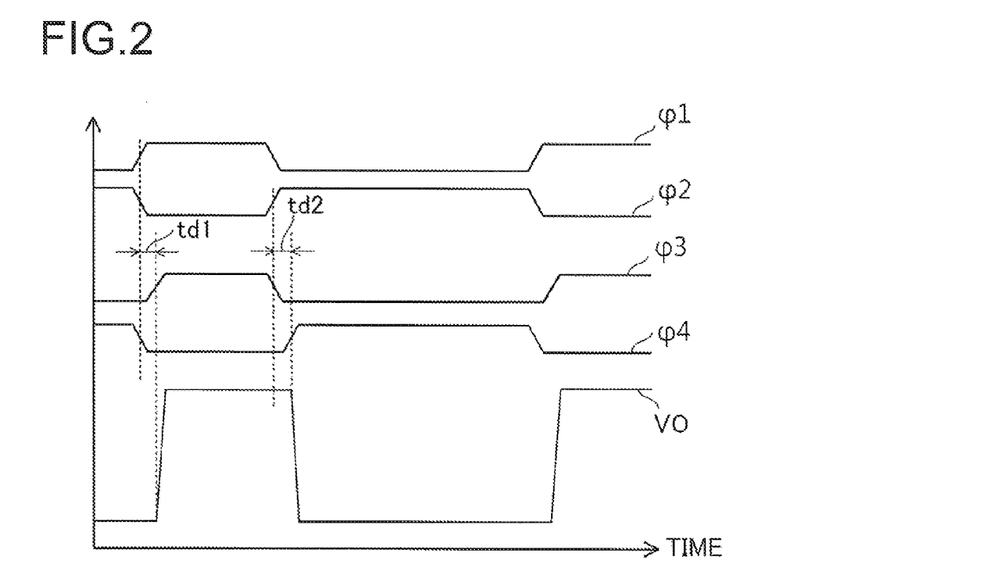
FIG. 2 is an operation timing chart of the driver circuit of FIG. 1.

A first embodiment of the present invention will be described. FIG. 1 is a circuit block diagram illustrating a configuration of a driver circuit according to the first embodiment of the present invention. The driver circuit of FIG. 1 includes input terminals T1 and T2, an output terminal T3, normally-on transistors Q1 and Q2, control circuits 1 to 3, a capacitor 4, a Zener diode 20, a resistance element 21, a MOSFET (Metal-Oxide-Semiconductor Field Effect Transistor) 16, a power source (main power source) 6, and a power source (control power source) 7. FIG. 2 is an operation timing chart of the driver circuit, illustrating a relationship between control signals φ1 to φ4, which will be described later, and a voltage VO of the output terminal T3. The normally-on transistors Q1 and Q2 constitute a half-bridge circuit. Hereinafter, a configuration in which the present invention is applied to a half-bridge circuit constituted by a serial connection of normally-on transistors is illustrated as an example, but the present invention may also be applied to a full-bridge circuit constituted by a serial connection of normally-on transistors.

The control signals φ1 and φ2 are supplied to the driver circuit from a higher-order controller (not illustrated) that controls the driver circuit. The input terminal T1 receives the control signal φ1, and the input terminal T2 receives the control signal φ2. Each of the control signals φ1 and φ2 takes an "H" level or an "L" level, which have mutually different logic levels (the same applies to the other control signals described later). With respect to a given signal or voltage, the potential of the "L" level is lower than the potential of the "H" level. The control signal φ2 is a complementary signal (i.e., inverted signal) of the control signal φ1. Therefore, when the control signal φ1 is at the "H" level, the control signal φ2 is at the "L" level; when the control signal φ1 is at the "L" level, the control signal φ2 is at the "H" level. The driver circuit outputs a voltage of the "H" level to the output terminal T3 in response to the control signals φ1 and φ2 being set to the "H" and "L" levels, respectively, and outputs a voltage of the "L" level to the output terminal T3 in response to the control signals φ1 and φ2 being set to the "L" level and the "H" level, respectively. The voltage of the "H" level at the output terminal T3 is a voltage V1 that is higher than a base voltage V2, and the voltage of the "L" level at the output terminal T3 is the base voltage V2.

Each of the transistors Q1 and Q2 is a normally-on transistor and is an n-channel FET (Field effect transistor) formed of a wide band gap semiconductor. At a given FET, when the gate-source voltage (the gate potential seen from the source potential) is no less than a predetermined threshold voltage Vth, the FET is on; and when the gate-source voltage is less than the threshold voltage Vth, the FET is off. An FET being on means that the source and the drain of the FET are electrically continuous; and an FET being off means that the source and the drain of the FET are electrically discontinuous. Each of the transistors Q1 and Q2, which are normally-on transistors, has a negative threshold voltage Vth and herein has the threshold voltage Vth of approximately −3 V. Therefore, the transistor Q1 is turned on even when the gate-source voltage of the transistor Q1 is 0 V (the same applied to the transistor Q2).

Here, a wide band gap semiconductor refers to a semiconductor having a band gap larger than that of silicon and, in particular, refers to a semiconductor having a band gap of no less than 2.2 eV (electron volt), which is approximately twice the band gap (1.12 eV) of silicon, and examples of such include SiC (silicon carbide), GaN (gallium nitride), and diamond.

The power source 6 generates the voltage V1 across a negative electrode and a positive electrode with its own negative electrode potential serving as a reference. The negative electrode of the power source 6 receives the base voltage V2. The base voltage V2 is, for example, 0 V, which is a ground voltage. Hereinafter, to give a concrete form to the descriptions, the base voltage V2 is assumed to be 0 V. In the transistor Q1, the drain is connected to a line to which the positive electrode of the power source 6 is connected and receives the voltage V1 (e.g., 400 V) from the positive electrode of the power source 6, the gate receives the control signal φ3, and the source is connected to the output terminal T3. In the transistor Q2, the drain is connected to the output terminal T3, the gate receives the control signal φ4, and the source is connected to a line to which the base voltage V2 is applied and receives the base potential V2.

The control circuit 1 on a high side (high voltage side) includes an input node 1a connected to the input terminal T1, an output node 1b connected to the gate of the transistor Q1, a high voltage side power source node 1c connected to the output terminal T3, and a low voltage side power source node 1d. The control signal φ1 is provided to the input node 1a via the input terminal T1. A signal that appears at the output node 1b serves as the control signal φ3.

The control circuit 1 turns on the transistor Q1 by outputting the voltage of the high voltage side power source node 1c through the output node 1b when the control signal φ1 is at the "H" level, and turns off the transistor Q1 by outputting the voltage of the low voltage side power source node 1d through the output node 1b when the control signal φ1 is at the "L" level (this operation is carried out after the capacitor 4 has been charged, as will be understood from the descriptions given later). However, when the control signal φ1 is switched from the "L" level to the "H" level, the control circuit 1 switches the voltage of the output node 1b from the voltage of the low voltage side power source node 1d to the voltage of the high voltage side power source node 1c after a predetermined delay time td1 has passed since the point at which the aforementioned switch has been made (refer to FIG. 2). When the control signal φ1 is switched from the "H" level to the "L" level, the control circuit 1 immediately switches the voltage of the output node 1b from the voltage of the high voltage side power source node 1c to the voltage of the low voltage side power source node 1d (refer to FIG. 2). The delay time td1 is set so as to prevent the transistors Q1 and Q2 from being on concurrently.

The control circuit 2 on a low side (low voltage side) includes an input node 2a connected to the input terminal T2, an output node 2b connected to the gate of the transistor Q2, a high voltage side power source node 2c that receives the base voltage V2, and a low voltage side power source node 2d. The control signal φ2 is provided to the input node 2a via the input terminal T2. A signal that appears at the output node 2b serves as the control signal φ4.

The control circuit 2 turns off the transistor Q2 by outputting the voltage of the low voltage side power source node 2d through the output node 2b when the control signal φ2 is at the "L" level (i.e., when the control signal φ1 is at the "H" level), and turns on the transistor Q2 by outputting the voltage of the high voltage side power source node 2c through the output node 2b when the control signal φ2 is at the "H" level (i.e., when the control signal φ1 is at the "L" level) (this operation is carried out after the power source 7 is started, as will be understood from the descriptions given later). However, when the control signal φ2 is switched from the "L" level to the "H" level, the control circuit 2 switches the voltage of the output node 2b from the voltage of the low voltage side power source node 2d to the voltage of the high voltage side power source node 2c after a predetermined delay time td2 has passed since the point at which the aforementioned switch has been made (refer to FIG. 2). When the control signal φ2 is switched from the "H" level to the "L" level, the control circuit 2 immediately switches the voltage of the output node 2b from the voltage of the high voltage side power source node 2c to the voltage of the low voltage side power source node 2d (refer to FIG. 2). The delay time td2 is set so as to prevent the transistors Q1 and Q2 from being on concurrently.

The capacitor 4 is connected between the high voltage side power source node 1c and the low voltage side power source node 1d of the control circuit 1. The MOSFET 16 is a normally-off n-channel MOSFET. In the MOSFET 16, the drain is connected to the low voltage side power source node 1d of the control circuit 1, the gate is connected to an output node 3c of the control circuit 3 and receives a control signal φ5, and the source is connected to a negative electrode of the power source 7 and the low voltage side power source node 2d of the control circuit 2. The MOSFET 16 is turned on when the control signal φ5 is at the "H" level and turned off when the control signal φ5 is at the "L" level.

A positive electrode of the power source 7 is connected to a line to which the base voltage V2 is applied, and the negative electrode of the power source 7 is connected to the low voltage side power source node 2d of the control circuit 2. As seen from the base voltage V2, the voltage at the negative electrode of the power source 7 is a negative voltage V3. The negative voltage V3 is lower than the threshold voltage Vth for the transistors Q1 and Q2 and is, for example, approximately −10 V.

The control circuit 3 includes a detection node 3a connected to the output terminal T3, a base voltage node 3b that receives the base voltage V2, and the output node 3c connected to the control electrode of the MOSFET 16 (i.e., the gate of the MOSFET 16). A signal that appears at the output node 3c serves as the control signal φ5. The voltage VO of the output terminal T3 is applied to the detection node 3a.

The control circuit 3 turns off the MOSFET 16 by setting the control signal φ5 to the "L" level when a voltage (VO−V2) corresponding to a difference between the voltage VO of the detection node 3a and the voltage V2 of the base voltage node 3b is higher than a predetermined reference voltage VR, and turns on the MOSFET 16 by setting the control signal φ5 to the "H" level when the voltage (VO−V2) is lower than the predetermined reference voltage VR. The reference voltage VR is a positive voltage of approximately 0 V, and "V1>VR" holds true.

The Zener diode 20 is connected in parallel to the capacitor 4. To be more specific, in the Zener diode 20, the cathode is connected to the high voltage side power source node 1c, and the anode is connected to the low voltage side power source node 1d. The resistance element 21 is connected between the low voltage side power source node 1d and the line of the base voltage V2.

Figure 3:
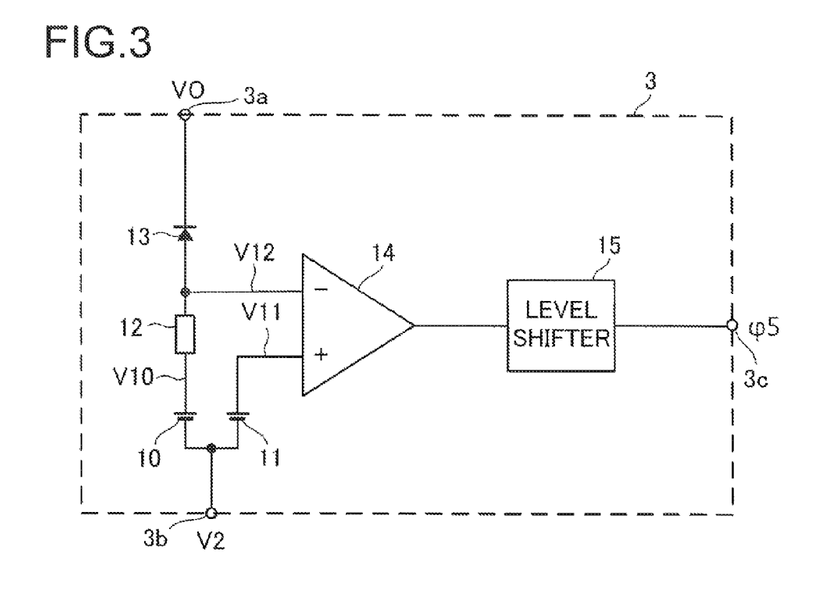
FIG. 3 is a circuit block diagram illustrating a configuration of a control circuit (3) of FIG. 1.

FIG. 3 is a circuit block diagram illustrating the configuration of the control circuit 3. In FIG. 3, the control circuit 3 includes power sources 10 and 11, a resistance element 12, a diode 13, a comparator 14, and a level shifter 15. Negative electrodes of the power sources 10 and 11 are both connected to the base voltage node 3b. Through the operation of the power sources 10 and 11, the voltages at positive electrodes of the power sources 10 and 11 become V10 and V11, respectively. The voltages V10 and V11 are both higher than the base voltage V2. The positive electrode of the power source 10 is connected to the anode of the diode 13 via the resistance element 12. The cathode of the diode 13 is connected to the detection node 3a. In order to prevent the diode 13 from being damaged, the diode 13 may be replaced with a plurality of diodes connected in series in the forward direction.

The positive terminal (non-inverting input terminal) of the comparator 14 is connected to the positive electrode of the power source 11 and thus receives the voltage V11 of the positive electrode of the power source 11. The negative terminal (inverting input terminal) of the comparator 14 is connected to a node between the resistance element 12 and the anode of the diode 13 and thus receives a voltage V12 of the anode of the diode 13. The level shifter 15 shifts the level of an output signal of the comparator 14 by a predetermined voltage and outputs the output signal to the output node 3c. A signal that appears at the output node 3c serves as the control signal $\phi 5$. Therefore, when "V11>V12" holds true, a signal of the "H" level is output from the comparator 14, and the control signal $\phi 5$ also becomes the "H" level as a result. Meanwhile, when "V11<V12" holds true, a signal of the "L" level is output from the comparator 14, and the control signal $\phi 5$ also becomes the "L" level as a result.

The voltage V10 of the power source 10 is set to a voltage higher than the voltage V11 of the power source 11. In addition, the forward direction voltage of the diode 13 is represented by "VF." In this case, when the voltage VO is higher than the voltage (V10−VF), the diode 13 turns off, which results in "V12=V10 (>V11)," and the control signal $\phi 5$ becomes the "L" level. Meanwhile, when the voltage VO is lower than the voltage (V10−VF), the diode 13 turns on, which results in "V12<V11<V10," and the control signal $\phi 5$ becomes the "H" level. Here, the voltage (V10−VF) is set to become as close to 0 V as possible.

Thus, the MOSFET 16 is turned on at a timing at which the voltage VO of the output terminal T3 has dropped to become substantially equal to the base voltage V2 (i.e., timing at which the voltage difference (VO−V2) falls below the predetermined reference voltage VR), and turned off at a timing at which the output voltage VO has risen to become higher than the base voltage V2 by a predetermined voltage.

When the voltage VO of the output terminal T3 becomes the "L" level and the MOSFET 16 turns on, the positive electrode of the power source 7 becomes connected to a high voltage side electrode (among the electrodes of the capacitor 4, the electrode connected to the power source node 1c) of the capacitor 4 via the transistor Q2, and the negative electrode of the power source 7 becomes connected to a low voltage side electrode (among the electrodes of the capacitor 4, the electrode connected to the power source node 1d) of the capacitor 4 via the MOSFET 16; thus, the capacitor 4 is charged. At this point, as a negative gate voltage for retaining the transistor Q1 is in an off state, the negative voltage V3 of the power source 7 is supplied to the gate of the transistor Q1 from the control circuit 1 via the MOSFET 16 and the low voltage side power source node 1d.

Thereafter, the transistors Q1 and Q2 and the MOSFET 16 are controlled on the basis of the control signals $\phi 1$ and $\phi 2$, the transistor Q1 is turned on, and the transistor Q2 and the MOSFET 16 are turned off. Since the transistor Q1 is of a normally-on type, the transistor Q1 enters an on state upon the voltage of the high voltage side power source node 1c being applied to the gate as a source voltage. When the transistor Q1 enters an on state, the output voltage VO rises close to the voltage V1 of the positive electrode of the power source 6.

At this point, the transistor Q2 and the MOSFET 16 are off, and thus the capacitor 4 is disconnected from the power source 7 and functions as a power source for the control circuit 1. At this stage, the voltage of the high voltage side electrode of the capacitor 4 is the output voltage VO, and the voltage of the low voltage side electrode of the capacitor 4 is lower than the output voltage VO. Thus, a voltage lower than the output voltage VO can be supplied to the gate of the transistor Q1; as a result, the transistor Q1 can be reliably turned off at a timing thereafter.

A negative voltage is needed in order to turn off a normally-on transistor on a high side, and a conventional driver circuit is often provided with a separate insulated power source as a power source for generating this negative voltage. Meanwhile, in the driver circuit of FIG. 1, it is possible to supply the negative voltage V3 to the control circuit 1 on the high side through the operation that uses the control circuit 3, the capacitor 4, and the MOSFET 16 without providing a separate insulated power source; thus, the size of the circuit can be reduced, and the circuit can be simplified. In addition, since the transistors Q1 and Q2 that are formed of a wide band gap semiconductor are used, the on-resistance value of the switching element can be reduced, and the switching speed thereof can be increased. Thus, the speed of the driver circuit can be increased, and the power consumption thereof can be reduced.

Here, a virtual driver circuit in which the Zener diode 20 and the resistance element 21 are removed from the driver circuit of FIG. 1 being assumed, a case in which the power source 6 is started before the other power sources (the power sources 7, 10, and 11) are started will be considered. In this case, while the voltage of the positive electrode (the line to which the drain of the transistor Q1 is connected) of the power source 6 rises toward the voltage V1, a period X in which the output voltages of the power sources 7, 10, and 11 are zero is generated. In this period X, the transistor Q1 is on due to the normally-on property, and thus the voltage VO of the output terminal T3 rises toward the voltage V1.

Meanwhile, as described above, the control circuit 3 operates so as to turn on the MOSFET 16 under the condition that "(VO−V2)<VR" holds true. Therefore, once the voltage VO of the output terminal T3 rises toward the voltage V1 to thus satisfy "(VO−V2)>VR" in the period X, even if the power sources 7, 10, and 11 are started thereafter, the MOSFET 16 is not turned on, and an opportunity to charge the capacitor 4, which is to serve as the power source for the control circuit 1, does not arise. As a result, the transistor Q1 cannot be turned off, and the voltage VO of the output terminal T3 is fixed at the "H" level (after the power source 7 is started, it is possible to turn off the transistor Q2 by using the negative voltage V3 through the control circuit 2).

In the virtual driver circuit, in order to resolve the fixing of the voltage VO at the "H" level, processing of temporarily stopping the operation of the power source 6, starting the circuits (including the power sources 7, 10, and 11 and the control circuits 1 to 3) other than the power source 6, and restarting the power source 6 is necessary. In other words, in the virtual driver circuit, a normal operation cannot be assured with the order of starting the power sources in which the voltage VO of the output terminal T3 becomes the "H" level first. In order to implement the aforementioned processing, the driver circuit needs to be equipped with a function dedicated for this processing, which may lead to an increase in the cost due to an increase in the size and the complexity of the driver circuit.

With the above taken into consideration, the driver circuit of FIG. 1 is provided with a startup circuit constituted by the Zener diode 20 and the resistance element 21. In other words, when the power source 6 is started before the other power sources (the power sources 7, 10, and 11) are started and the voltage of the line to which the drain of the transistor Q1 is connected thus rises toward V1 in the period X, the voltage of the high voltage side power source node 1c also rises toward V1 concurrently since the transistor Q1 is on due to the normally-on property. In this case, a current flows through the Zener diode 20 and the resistance element 21 and a Zener voltage Vz is generated across the two ends of the Zener diode 20 (here, "V1>Vz") in the period X, and the capacitor 4 is charged by this generated voltage Vz. In other words, although "(VO−V2)>VR" becomes satisfied and the MOSFET 16 is turned off in the period X, the capacitor 4 is charged via the startup circuit on the basis of the voltage Vz. Upon the capacitor 4 being charged, the control circuit 1 that uses the charged voltage (voltage across the electrodes) of the capacitor 4 as the power source voltage is started, making it possible to control the transistor Q1 via the control signal φ3. That is, the control circuit 1 can be self-started as the power source 6 is started.

Thereafter, (e.g., after the period X), the control signals φ1 and φ2 become the "L" and "H" levels, respectively, and thus the voltage VO of the output terminal T3 becomes the "L" level. After the voltage VO of the output terminal T3 has become the "L" level, the capacitor 4 is charged via the MOSFET 16 through the function of the control circuit 3 each time the voltage VO becomes the "L" level during an iterative operation in which the voltage VO is switched between the "H" and "L" levels (refer to FIG. 2).

As described thus far, in the present embodiment, the control circuit 1 can be started even through the order of powering on the power sources is such that the voltage VO of the output terminal T3 becomes the "H" level first in a configuration in which the normally-on transistors are connected in series, and a normal operation of the driver circuit can be assured without providing a separate insulated power source.

In other words, in the driver circuit according to the present embodiment, even if the voltage VO of the output terminal T3 becomes the "H" level when the power source is started, the capacitor 4 is charged by the startup circuit, and the control circuit 1 starts, making it possible to turn off the transistor Q1. When the voltage VO once becomes the "L" level due to the transistor Q1 being turned off, the capacitor 4 can continue to be charged as the MOSFET 16 is turned on through the functions of the control circuits that respond to the control signals φ1 and φ2. As a result, even if the bridge circuit is formed by the normally-on transistors, the power source for the control circuit 1 can be self-fed while an arm short at the time of starting (short in the transistors Q1 and Q2) is prevented.

Here, the driver circuit of FIG. 8 will be further described. In FIG. 8, the control circuit 908 needs to drive the gate of the upper-side transistor 914 with the source potential of the upper-side transistor 914 serving as a reference and is thus a circuit insulated from the ground potential (V2). In addition, the power source (not illustrated) of the control circuit 908 needs to supply, to the control circuit 908, a constant voltage that is lower than the voltage V1, which as if corresponds to the voltage of the node 1d of FIG. 1. The reason for this is that, if the constant voltage that is lower than the voltage V1 is not being supplied to the control circuit 908 when the upper-side transistor 914 is on and the output 923 is at the high level (V1), the upper-side transistor 914, which is a normally-on transistor, cannot be turned off. In consideration for the self-feeding of the power source for the control circuit 908, it is possible to add a power source capacitor, as in the capacitor 4 of FIG. 1, to the configuration of FIG. 8 to serve as the power source for the control circuit 908 (this power source capacitor is not illustrated in FIG. 8), but as in the above-described virtual driver circuit, this power source capacitor is not charged unless the output 923 becomes the low level, and the constant voltage thus cannot be supplied to the control circuit 908.

Therefore, when only the power source for the control circuit 911 shuts down without the main power source 912 being turned off and the output 923 becomes the high level as the upper-side transistor 914 is turned on, the control circuit 908 cannot be restarted unless processing of temporarily stopping the operation of the main power source 912 and restarting the main power source 912 after the control circuit 911 is started first is carried out. Again, this is because, unless the output 923 becomes the low level, an opportunity to charge the aforementioned power source capacitor does not arise.

Second Embodiment

A second embodiment of the present invention will be described. The second embodiment and third through fifth embodiments described later are embodiments that are based on the first embodiment, and to features that not particularly described in the second through fifth embodiments, the descriptions in the first embodiment apply in the second through fifth embodiments as well unless any contradiction arises.

Figure 4:
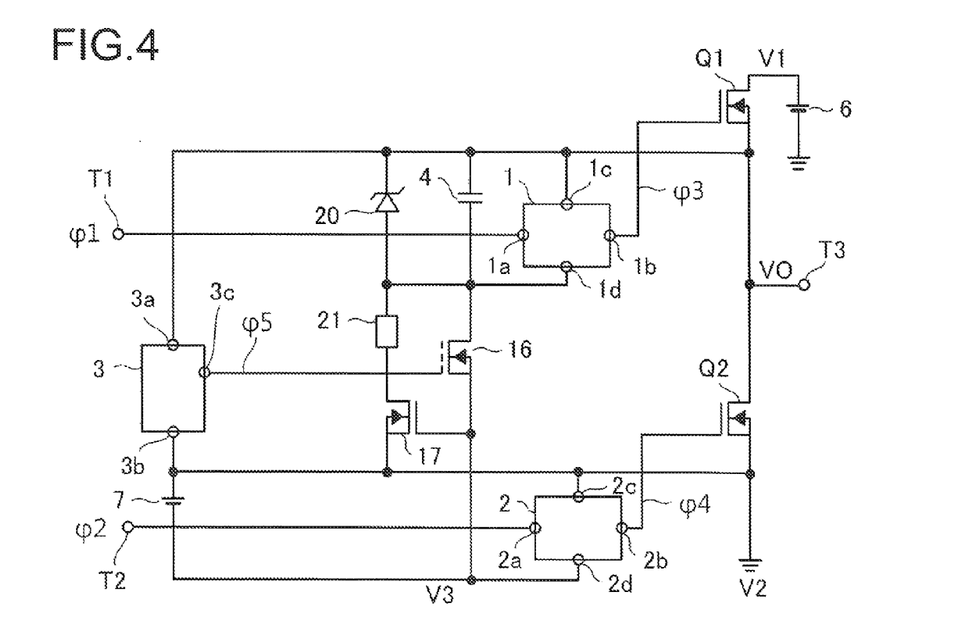
FIG. 4 is a circuit block diagram illustrating a configuration of a driver circuit according to a second embodiment of the present invention.

FIG. 4 is a circuit block diagram illustrating a configuration of a driver circuit according to the second embodiment of the present invention. In the driver circuit of FIG. 4, what differs from the driver circuit of FIG. 1 is that a MOSFET 17 is added. In other words, what is obtained by adding the MOSFET 17 to the driver circuit of FIG. 1 is the driver circuit of FIG. 4. The MOSFET 17 is a normally-on n-channel MOSFET.

A startup circuit in the driver circuit of FIG. 4 is formed by a series circuit of the Zener diode 20, the resistance element 21, and the MOSFET 17. Specifically, in FIG. 4, the cathode of the Zener diode 20 is connected to the power source node 1c, the anode of the Zener diode 20 is connected to the power source node 1d and one end of the resistance element 21, another end of the resistance element 21 is connected to the drain of the MOSFET 17, the source of the MOSFET 17 is connected to the line of the base voltage V2 (thus, the positive electrode of the power source 7), and the gate of the MOSFET 17 is connected to the negative electrode of the power source 7. Thus, the MOSFET 17 is turned on/off on the basis of the voltage across the positive electrode and the negative electrode of the power source 7 that is to generate the negative electrode V3.

In the driver circuit of FIG. 4 as well, similarly to the driver circuit of FIG. 1, when the power source 6 is started before the other power sources (the power sources 7, 10, and 11) are started and the voltage of the line to which the drain of the transistor Q1 is connected rises toward V1, the voltage of the high voltage side power source node 1c also rises concurrently toward V1 since the transistor Q1 is on due to the normally-on property. Likewise, the MOSFET 17 is also on during the period X in which the power source 7 is not started (during the period X in which the voltage across the positive electrode and the negative electrode of the power source 7 is 0 V) due to the normally-on property.

In this case, a current flows through the Zener diode 20 and the resistance element 21 via the MOSFET 17 and the Zener voltage Vz is generated across the two ends of the Zener diode 20 in the period X, and the capacitor 4 is charged by this generated voltage Vz. In other words, "(VO−V2)>VR" becomes satisfied and the MOSFET 16 is turned off in the period X, but the capacitor 4 is charged via the startup circuit on the basis of the voltage Vz. Upon the capacitor 4 being charged, the control circuit 1 that uses the charged voltage (voltage across the electrodes) of the capacitor 4 as the power source voltage is started, making it possible to control the transistor Q1 via the control signal φ3.

When the power source 7 starts being started after the period X, the gate-source voltage (the gate potential seen from the source potential) of the MOSFET 17 decreases from 0 V, and the MOSFET 17 is turned off upon the gate-source voltage falling below a predetermined threshold voltage (the absolute value of the threshold voltage for the MOSFET 17 is smaller than the absolute value of the negative voltage V3). The threshold voltage for the MOSFET 17 is a negative voltage, and thus the negative voltage V3 is suitable for use in the on/off control of the MOSFET 17. When the MOSFET 17 is turned off as the power source 7 is started, the flow of the current via the resistance element 21 is shut off. In other words, the startup circuit stops on its own after the power source 7 is started. As a result, a noise current that is based on a change in the output voltage VO can be prevented from flowing into the line of the base voltage V2 via the startup circuit. Of course, the function and the effect of the driver circuit of FIG. 1 are implemented in the driver circuit of FIG. 4 as well.

Third Embodiment

A third embodiment of the present invention will be described. In the driver circuit of FIG. 1 or FIG. 4, the Zener diode 20 may be replaced with a series circuit 20A of n diodes in which the direction from the power source node 1c to the power source node 1d is the forward direction. The series circuit 20A of n diodes is connected between the power source nodes 1c and 1d. Here, n is an integer no less than 2.

Figure 5:
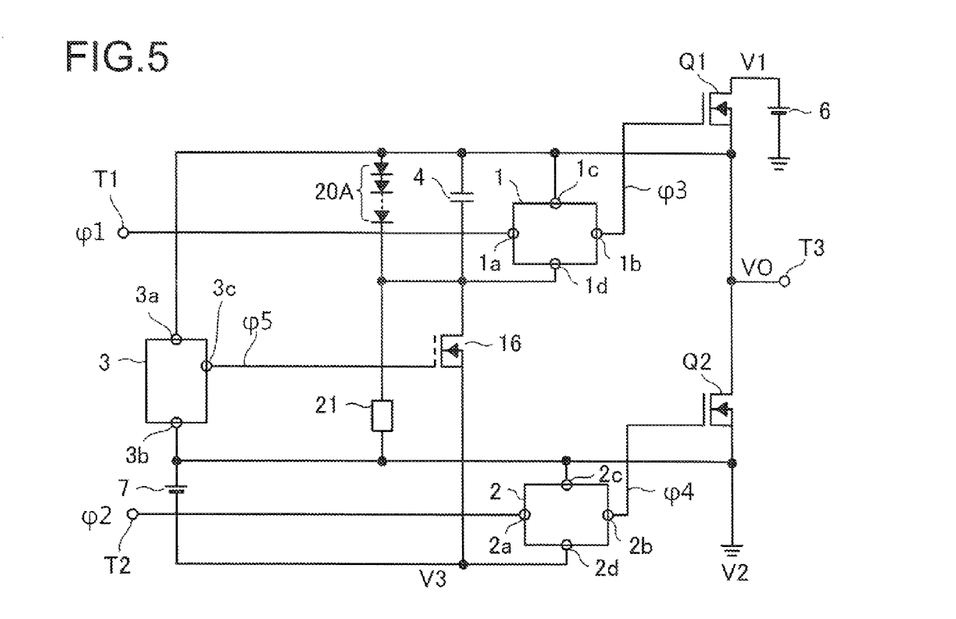
FIG. 5 is a circuit block diagram illustrating a configuration of a driver circuit according to a third embodiment of the present invention.

A configuration block diagram of a driver circuit obtained by applying the aforementioned replacement to the driver circuit of FIG. 1 is illustrated in FIG. 5. The series circuit 20A is constituted by first to nth diodes. The anode of the first diode disposed at one end of the series circuit 20A is connected to the power source node 1c, and the cathode of the nth diode disposed at another end of the series circuit 20A is connected to the power source node 1d. The cathode of an ith diode is connected to the anode of an (i+1)th diode (i is a natural number no greater than (n−1)).

The value of n is set so that the total voltage of the forward direction voltages of the first to nth diodes held when the first to nth diodes are on (i.e., the voltage across the two ends of the series circuit 20A when the forward direction current flows through the first to nth diodes) becomes equal to or substantially equal to the aforementioned Zener voltage Vz. Thus, the series circuit 20A of n diodes carries out an operation equivalent to that of the Zener diode 20.

Fourth Embodiment

A fourth embodiment of the present invention will be described. In the driver circuit of FIG. 1 or FIG. 4, the Zener diode 20 may be replaced with a resistance element 20B. The resistance element 20B is connected between the power source nodes 1c and 1d.

Figure 6:
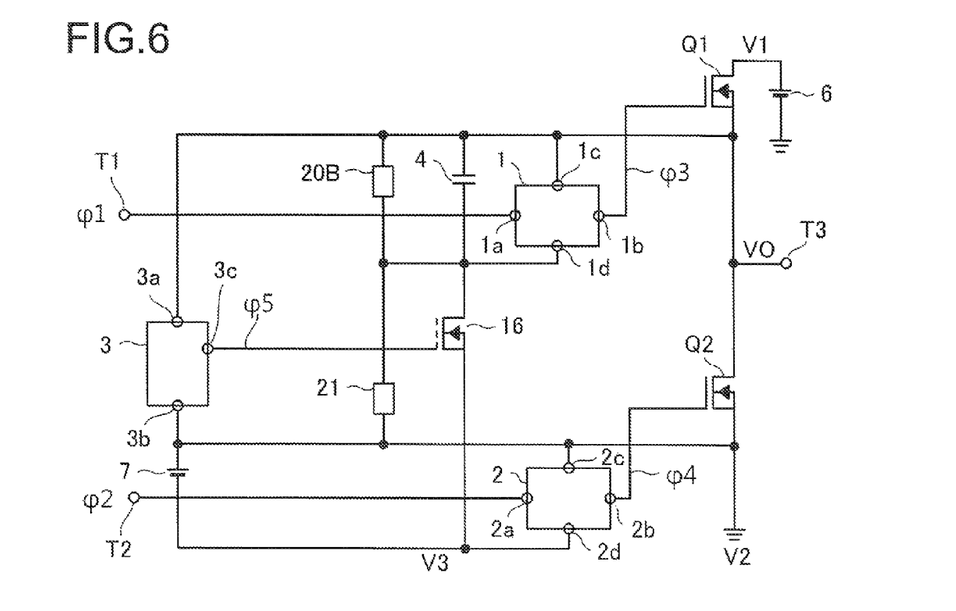
FIG. 6 is a circuit block diagram illustrating a configuration of a driver circuit according to a fourth embodiment of the present invention.

A configuration block diagram of a driver circuit obtained by applying the aforementioned replacement to the driver circuit of FIG. 1 is illustrated in FIG. 6. In the driver circuit of FIG. 6, a startup circuit is formed by the resistance elements 20B and 21.

In other words, in the driver circuit of FIG. 6, when the power source 6 is started before the other power sources (the power sources 7, 10, and 11) are started and the voltage of the line to which the drain of the transistor Q1 is connected rises toward V1, the voltage of the high voltage side power source node 1c also rises concurrently toward V1 since the transistor Q1 is on due to the normally-on property. In this case, a current flows through the resistance element 20B and the resistance element 21 and a voltage $V_{20B}$ is generated across the two ends of the resistance element 20B in the above-described period X, and the capacitor 4 is charged by this generated voltage $V_{20B}$. In other words, "(VO−V2)> VR" becomes satisfied and the MOSFET 16 is turned off in the above-described period X, but the capacitor 4 is charged via the startup circuit on the basis of the voltage $V_{20B}$. Upon the capacitor 4 being charged, the control circuit 1 that uses the charged voltage (voltage across the electrodes) of the capacitor 4 as the power source voltage is started, making it possible to control the transistor Q1 via the control signal φ3. That is, the control circuit 1 can be self-started as the power source 6 is started.

However, in the driver circuit of FIG. 6, a current continues to flow via the resistance elements 20B and 21 even after the entire driver circuit is started, and thus loss increases by an amount corresponding to the loss associated with that current, as compared to a case in which the Zener diode 20 or the series circuit 20A of diodes is used. For example, when the Zener diode 20 is used, if the driver circuit is designed such that the voltage of the capacitor 4 stabilizes at a voltage lower than the Zener voltage Vz after the entire driver circuit is started after the period X, an unnecessary current can be prevented from continuing to flow through the Zener voltage 20.

In this respect, it is preferable that a modification in which the Zener diode 20 is replaced with the resistance element 20B be applied in particular to the driver circuit of FIG. 4. This is because, in the driver circuit of FIG. 4, a flow of a current via the resistance element 21 is shut off after the power source 7 is started.

Fifth Embodiment

Figure 7:
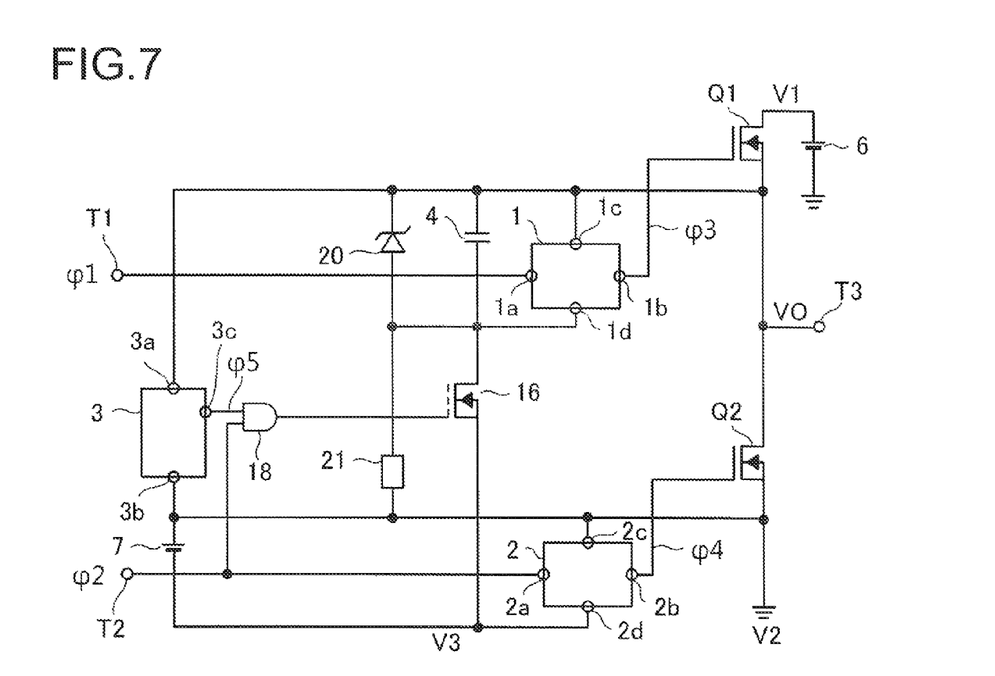
FIG. 7 is a circuit block diagram illustrating a configuration of a driver circuit according to a fifth embodiment of the present invention.

A fifth embodiment of the present invention will be described. In the driver circuit of FIG. 1, FIG. 4, FIG. 5, or FIG. 6, an AND gate (logical product circuit) 18 may be added. A configuration block diagram of a driver circuit obtained by applying the aforementioned addition to the driver circuit of FIG. 1 is illustrated in FIG. 7. The AND gate 18 provides a logical product signal of the control signals φ5 and φ2 to the gate of the MOSFET 16. Thus, in the driver circuit of FIG. 7, the MOSFET 16 is turned on when the control signals φ5 and φ2 are both at the "H" level and is turned off when at least one of the control signals φ5 and φ2 is at the "L" level. In other words, the MOSFET 16 of FIG. 7 is turned on only when the voltage difference (VO−V2) falls below the predetermined reference voltage VR so that the control signal φ5 becomes the "H" level and the control signal φ2 is at the "H" level (thus, the control signal φ1 is at the "L" level). Thus, the MOSFET 16 can be reliably prevented from being turned on when the output voltage VO is high.

<Other Modifications, Etc.>

Various modifications can be made, as appropriate, to the embodiments of the present invention within the scope of the technical spirit set forth in the claims. The foregoing embodiments are merely examples of embodiments of the present invention, and the meanings of the terms for the present invention and for each constituent element are not limited to those described in the foregoing embodiments.

The specific numerical values indicated in the foregoing descriptions are merely examples, and these values can of course be changed to various other numerical values.

In each of the driver circuits described above, the MOSFET 16 functions as a switching element that switches whether the node between the capacitor 4 and the power source node 1*d* is to be connected to the negative electrode of the power source 7 and the power source node 2*d*. This switching element may be a switching element other a MOSFET and, for example, may be a bipolar transistor. This switching element may be formed of a wide band gap semiconductor.

<Consideration of the Present Invention>

The present invention will be considered.

A driver circuit according to one aspect of the present invention includes a first transistor (Q1) connected between a line of a first voltage (V1) and an output terminal (T3), a second transistor (Q2) connected between the output terminal and a line of a second voltage (V2) lower than the first voltage, a first control circuit (1) having first and second power source nodes (1*c*, 1*d*) and configured to provide a voltage of the first power source node to a control electrode of the first transistor in response to an input signal ($\phi$1) being set to a first logic level so as to turn on the first transistor and to provide a voltage of the second power source node to the control electrode of the first transistor in response to the input signal being set to a second logic level so as to turn off the first transistor, and a second control circuit (2) having third and fourth power source nodes (2*c*, 2*d*) and configured to provide a voltage of the fourth power source node to a control electrode of the second transistor in response to the input signal being set to the first logic level so as to turn off the second transistor and to provide a voltage of the third power source node to the control electrode of the second transistor in response to the input signal being set to the second logic level so as to turn on the second transistor. Each of the first and second transistors is a normally-on transistor. The first power source node is connected to the output terminal. The third power source node receives the second voltage. The fourth power source node receives a third voltage (V3) lower than the second voltage. The driver circuit further includes a capacitor (4) connected between the first and second power source nodes, a switching element (16) connected between the second and fourth power source nodes, a third control circuit (3) configured to turn on the switching element so as to charge the capacitor in response to a voltage corresponding to a difference between a voltage of the output terminal and the second voltage falling below a preset voltage, and a startup circuit having a voltage generating component (20, 20A, 20B) connected between the first and second power source nodes and a current passing component (21 or 21 and 17) connected between the second and third power source nodes and capable of charging the capacitor on the basis of a generated voltage of the voltage generating component even when the switching element is off by causing a current that is based on a voltage across the first and third power source nodes to pass through the voltage generating component and the current passing component.

In the above driver circuit, the capacitor can be charged by turning on the switching element in response to the voltage corresponding to the difference between the voltage of the output terminal and the second voltage falling below the preset voltage, and thus the power source for the first control circuit can be self-fed. In this case, there is a concern that the voltage difference is retained at a voltage higher than the preset voltage depending on the order in which the power sources are powered on or the like, and depending on the configuration of the driver circuit, a dedicated function that temporarily stops the operation of the power source for the first voltage and restarts the power source for the first voltage after starting other circuits becomes necessary.

However, in the driver circuit according to the present invention, even if the voltage of the output terminal becomes relatively high when being started and the switching element is not turned on, the capacitor is charged by the startup circuit, and the first control circuit starts; thus, the first transistor can be turned off. Once the voltage of the output terminal drops as the first transistor is turned off, the capacitor can continue to be charged as the switching element is turned on through the function of each control circuit that responds to the input signal. As a result, irrespective of the order in which the power sources are powered on or the like, the power source for the first control circuit can be self-fed while preventing a short in the first and second transistors at the time of starting. As the power source for the first control circuit is self-fed, the above-described dedicated function is rendered unnecessary; thus, the size of the circuit can be reduced, and the circuit can be simplified accordingly.

Specifically, for example, the voltage generating component may include a Zener diode (20) having a cathode and an anode connected to the first and second power source nodes, respectively, or a series circuit (20A) of a plurality of diodes connected between the first and second power source nodes with a direction from the first power source node to the second power source node being a forward direction.

Thus, even if the voltage of the output terminal becomes relatively high when being started and the switching element is not turned on, a voltage is generated in the Zener diode or in the series circuit, and the capacitor can be charged on the basis of the generated voltage.

Alternatively, for example, the voltage generating component may include a voltage generating resistance element (20B) connected between the first and second power source nodes.

Thus, even if the voltage of the output terminal becomes relatively high when being started and the switching element is not turned on, a voltage is generated in the voltage generating resistance element, and the capacitor can be charged on the basis of the generated voltage.

In addition, for example, the current passing component may include a resistance element (21) connected between the second and third power source nodes.

Thus, when the voltage of the output terminal is relatively high when being started, a current that is based on the voltage across the first and third power source nodes can be passed through the voltage generating component and the current passing component so as to charge the capacitor on the basis of the generated voltage of the voltage generating component.

Alternatively, for example, the current passing component may include a series circuit of a resistance element (21) and a starting switching element (17), and the series circuit may be connected between the second and third power source nodes.

As the current passing component includes the starting switching element, it becomes possible to shut off a flow of the current at a timing at which the current does not need to be passed to the startup circuit, which makes it possible to suppress unwanted power loss.

Specifically, for example, the starting switching element is a normally-on transistor that is turned on/off on the basis of a voltage across a positive electrode and a negative electrode of a power source (7) that is to generate the third voltage, and the starting switching element may be turned on before the power source is started and may be turned off after the power source is started.

Thus, the starting switching element is turned on/off appropriately in accordance with a state of the power source that is to generate the third voltage, without the need to provide a separate control circuit.

In addition, for example, the third control circuit may turn on the switching element when the voltage corresponding to the difference between the voltage of the output terminal and the second voltage falls below the preset voltage and the input signal is at the second logic level.

Thus, the switching element can be reliably prevented from being turned on when the voltage of the output terminal is high.

In addition, for example, each normally-on transistor may be an n-channel FET formed by a wide band gap semiconductor.

In addition, for example, the switching element may be an n-channel MOSFET.

REFERENCE SIGNS LIST 1 to 3 CONTROL CIRCUIT
4 CAPACITOR
6, 7 POWER SOURCE
16 N-CHANNEL MOSFET
17 NORMALLY-ON N-CHANNEL MOSFET
20 ZENER DIODE
20A SERIES CIRCUIT OF DIODES
20B RESISTANCE ELEMENT
21 RESISTANCE ELEMENT
Q1, Q2 NORMALLY-ON TRANSISTOR
φ1 to φ5 CONTROL SIGNAL

The invention claimed is:
1. A driver circuit, comprising:
a first transistor connected between a line of a first voltage and an output terminal;
a second transistor connected between the output terminal and a line of a second voltage lower than the first voltage;
a first control circuit having first and second power source nodes and configured to provide a voltage of the first power source node to a control electrode of the first transistor in response to an input signal being set to a first logic level so as to turn on the first transistor and to provide a voltage of the second power source node to the control electrode of the first transistor in response to the input signal being set to a second logic level so as to turn off the first transistor; and
a second control circuit having third and fourth power source nodes and configured to provide a voltage of the fourth power source node to a control electrode of the second transistor in response to the input signal being set to the first logic level so as to turn off the second transistor and to provide a voltage of the third power source node to the control electrode of the second transistor in response to the input signal being set to the second logic level so as to turn on the second transistor,
wherein each of the first and second transistors is a normally-on transistor,
wherein the first power source node is connected to the output terminal,
wherein the third power source node receives the second voltage,
wherein the fourth power source node receives a third voltage lower than the second voltage, and
wherein the driver circuit further includes
a capacitor connected between the first and second power source nodes,
a switching element connected between the second and fourth power source nodes,
a third control circuit configured to turn on the switching element so as to charge the capacitor in response to a voltage corresponding to a difference between a voltage of the output terminal and the second voltage falling below a preset voltage, and
a startup circuit having a voltage generating component connected between the first and second power source nodes and a current passing component connected between the second and third power source nodes and capable of charging the capacitor on the basis of a generated voltage of the voltage generating component even when the switching element is off by causing a current that is based on a voltage across the first and third power source nodes to pass through the voltage generating component and the current passing component.

2. The driver circuit according to claim 1,
wherein the voltage generating component includes
a Zener diode having a cathode and an anode connected to the first and second power source nodes, respectively, or
a series circuit of a plurality of diodes connected between the first and second power source nodes with a direction from the first power source node to the second power source node being a forward direction.

3. The driver circuit according to claim 2,
wherein the current passing component includes a resistance element connected between the second and third power source nodes.

4. The driver circuit according to claim 2,
wherein the current passing component includes a series circuit of a resistance element and a starting switching element, and
wherein the series circuit is connected between the second and third power source nodes.

5. The driver circuit according to claim 2,
wherein the third control circuit turns on the switching element when the voltage corresponding to the difference between the voltage of the output terminal and the second voltage falls below the preset voltage and the input signal is at the second logic level.

6. The driver circuit according to claim 2,
wherein each normally-on transistor is an n-channel FET formed by a wide band gap semiconductor.

7. The driver circuit according to claim 1,
wherein the voltage generating component includes a voltage generating resistance element connected between the first and second power source nodes.

8. The driver circuit according to claim 7,
wherein the current passing component includes a resistance element connected between the second and third power source nodes.

9. The driver circuit according to claim 7,
wherein the current passing component includes a series circuit of a resistance element and a starting switching element, and
wherein the series circuit is connected between the second and third power source nodes.

10. The driver circuit according to claim 7,
wherein the third control circuit turns on the switching element when the voltage corresponding to the difference between the voltage of the output terminal and the second voltage falls below the preset voltage and the input signal is at the second logic level.

11. The driver circuit according to claim 7,
wherein each normally-on transistor is an n-channel FET formed by a wide band gap semiconductor.

12. The driver circuit according to claim 1,
wherein the current passing component includes a resistance element connected between the second and third power source nodes.

13. The driver circuit according to claim 12,
wherein the third control circuit turns on the switching element when the voltage corresponding to the difference between the voltage of the output terminal and the second voltage falls below the preset voltage and the input signal is at the second logic level.

14. The driver circuit according to claim 1,
wherein the current passing component includes a series circuit of a resistance element and a starting switching element, and
wherein the series circuit is connected between the second and third power source nodes.

15. The driver circuit according to claim 14,
wherein the starting switching element is a normally-on transistor that is turned on/off on the basis of a voltage across a positive electrode and a negative electrode of a power source that is to generate the third voltage, and the starting switching element is turned on before the power source is started and is turned off after the power source is started.

16. The driver circuit according to claim 15,
wherein the third control circuit turns on the switching element when the voltage corresponding to the difference between the voltage of the output terminal and the second voltage falls below the preset voltage and the input signal is at the second logic level.

17. The driver circuit according to claim 14,
wherein the third control circuit turns on the switching element when the voltage corresponding to the difference between the voltage of the output terminal and the second voltage falls below the preset voltage and the input signal is at the second logic level.

18. The driver circuit according to claim 1,
wherein the third control circuit turns on the switching element when the voltage corresponding to the difference between the voltage of the output terminal and the second voltage falls below the preset voltage and the input signal is at the second logic level.

19. The driver circuit according to claim 1,
wherein each normally-on transistor is an n-channel FET formed by a wide band gap semiconductor.

20. The driver circuit according to claim 1,
wherein the switching element is an n-channel MOSFET.

* * * * *